United States Patent
Okawa (10) Patent No.: US 10,692,876 B2
(45) Date of Patent: Jun. 23, 2020

(54) SEMICONDUCTOR DEVICE AND METHOD OF MANUFACTURING THE SAME

(71) Applicant: Toshiba Memory Corporation, Tokyo (JP)

(72) Inventor: Takamasa Okawa, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/275,260

(22) Filed: Feb. 13, 2019

(65) Prior Publication Data

US 2020/0083241 A1 Mar. 12, 2020

(30) Foreign Application Priority Data

Sep. 10, 2018 (JP) ................ 2018-169045

(51) Int. Cl.
*H01L 27/11565* (2017.01)
*H01L 27/11582* (2017.01)
*H01L 21/28* (2006.01)
*H01L 27/11521* (2017.01)
*H01L 27/115* (2017.01)

(52) U.S. Cl.
CPC .. *H01L 27/11565* (2013.01); *H01L 27/11582* (2013.01); *H01L 27/115* (2013.01); *H01L 27/11521* (2013.01); *H01L 29/40117* (2019.08)

(58) Field of Classification Search
CPC ............. H01L 27/115; H01L 27/11568; H01L 27/11521; H01L 29/792; H01L 21/28282; H01L 27/1157; H01L 21/28273
USPC ........ 257/314, 315, 316, 326; 438/201, 211, 438/257
See application file for complete search history.

(56) References Cited

U.S. PATENT DOCUMENTS

| | | | |
|---|---|---|---|
| 8,198,670 B2 | 6/2012 | Aoyama | |
| 9,111,963 B2 | 8/2015 | Murakami | |
| 9,508,731 B2 | 11/2016 | Wolstenholme | |
| 9,966,386 B2 | 5/2018 | Kato et al. | |
| 2014/0284686 A1* | 9/2014 | Murakami | H01L 27/1157 257/324 |
| 2017/0053935 A1 | 2/2017 | Fukuzumi et al. | |
| 2017/0263638 A1 | 9/2017 | Okada | |
| 2018/0019253 A1 | 1/2018 | Kinoshita | |

FOREIGN PATENT DOCUMENTS

JP 2010219409 A 9/2010

* cited by examiner

*Primary Examiner* — Thinh T Nguyen
(74) *Attorney, Agent, or Firm* — Kim & Stewart LLP (57) ABSTRACT

A semiconductor device includes a first film that includes first electrode layers separated from each other in a first direction and extending in second and third directions, first columnar portions in the first film, that include a charge storage layer and a first semiconductor layer, and extend in the first direction, a second film on the first film and including second electrode layers separated from each other in the first direction and extending in second and third directions, second columnar portions in the second film and on the first columnar portions, that include a second semiconductor layer and extend in the first direction, and first insulating films separated from the second columnar portions in the third direction in the second film and extending in first and second directions. The first columnar portions form a square or rectangular lattice pattern below the first insulating films and a triangular lattice pattern elsewhere.

14 Claims, 12 Drawing Sheets

SEMICONDUCTOR DEVICE AND METHOD OF MANUFACTURING THE SAME

CROSS-REFERENCE TO RELATED APPLICATION

This application is based upon and claims the benefit of priority from. Japanese Patent Application No. 2018-169045, filed Sep. 10, 2018, the entire contents of which are incorporated herein by reference.

FIELD

Embodiments described herein relate generally to a semiconductor device and a method of manufacturing the same.

BACKGROUND

In the manufacture of a three-dimensional memory, the size of a chip can be reduced by arranging memory holes with a smaller distance between them. However, if the memory holes are not appropriately arranged, problems can occur, such as large voids or the like formed in an electrode layer when the electrode layer is embedded around a columnar portion in the memory hole. Therefore, a method of more appropriately reducing the chip size is desired.

DETAILED DESCRIPTION

Embodiments provide a semiconductor device capable of reducing a chip size and a method of manufacturing thereof.

In general, according to one embodiment, there is provided a semiconductor device including a first film that includes a plurality of first electrode layers stacked so as to be separated from each other in a first direction and extending in a second direction and a third direction each crossing the first direction, and a plurality of first columnar portions that are provided in the first film, include a charge storage layer and a first semiconductor layer, and extend in the first direction through the first electrode layers. The semiconductor device further includes a second film that is provided on the first film and includes a plurality of second electrode layers stacked so as to be separated from each other in the first direction and extending in the second direction and the third direction, and a plurality of second columnar portions that are provided in the second film and on the first columnar portions, include a second semiconductor layer, and extend in the first direction through the second electrode layers. The semiconductor device further includes a plurality of first insulating films that are provided in the second film so as to be separated from the second columnar portions in the third direction and extend in the first direction through the second electrode layers and the second direction. The first columnar portions are arranged in a triangular lattice pattern in first regions and in a square or rectangular lattice pattern in second regions that are separate from the first regions and are aligned with the first insulating films in the first direction.

Hereinafter, an embodiment of the present invention will be described with reference to the drawings. In FIGS. 1 to 20, the same or similar configuration is denoted by the same reference numeral, and duplicate description is omitted.

First Embodiment

Figure 1:
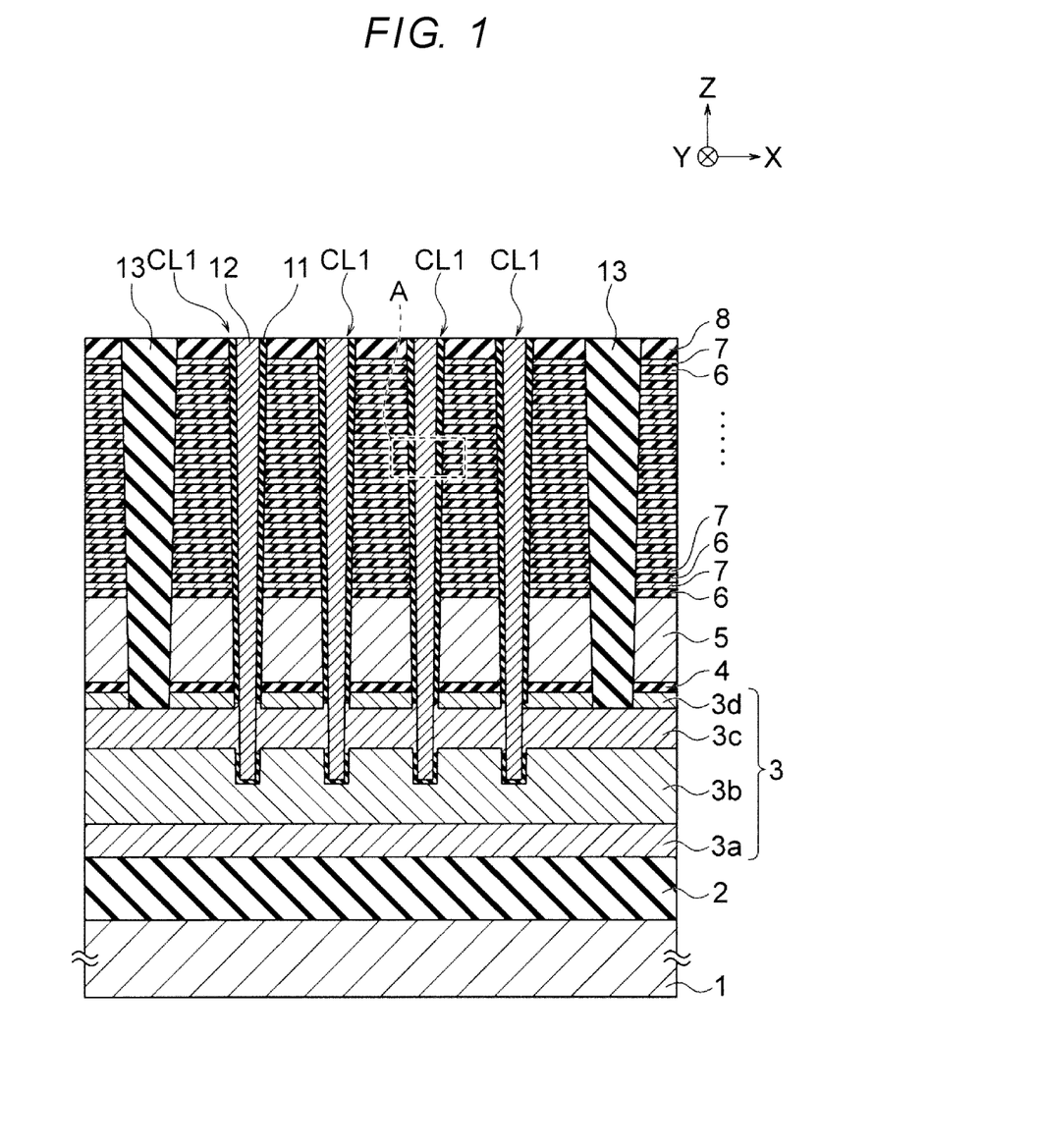
FIG. 1 is a cross-sectional view showing a structure of a semiconductor device of a first embodiment.

FIG. 1 is a cross-sectional view showing a structure of a semiconductor device of a first embodiment. The semiconductor device in FIG. 1 is, for example, a three-dimensional memory.

The semiconductor device of FIG. 1 includes a substrate 1, a first interlayer insulating film 2, a source layer 3, a second interlayer insulating film 4, a gate layer 5, a plurality of insulating layers 6, a plurality of electrode layers 7, a third interlayer insulating film 8, a memory insulating film 11, a channel semiconductor layer 12, and a plurality of element isolation insulating films 13.

The substrate 1 is, for example, a semiconductor substrate such as a silicon substrate. FIG. 1 shows an X direction and a Y direction parallel to the upper surface of the substrate 1 and perpendicular to each other, and a Z direction perpendicular to the surface of the substrate 1. In the present specification, +Z direction is treated as an upward direction, and −Z direction is treated as a downward direction. The −Z direction may coincide with the direction of gravity or may not coincide with the direction of gravity. The Z direction is an example of a first direction, the Y direction is an example of a second direction, and the X direction is an example of a third direction. The X direction, the Y direction, and the Z direction cross each other.

The first interlayer insulating film 2, the source layer 3, the second interlayer insulating film 4, and the gate layer 5 are sequentially formed on the substrate 1. The first interlayer insulating film 2 is, for example, a silicon oxide film or a silicon nitride film. The source layer 3 includes a metal layer 3a, a lower semiconductor layer 3b, an intermediate semiconductor layer 3c, and an upper semiconductor layer 3d which are sequentially formed on the first interlayer insulating film 2. The metal layer 3a is, for example, a tungsten layer or a tungsten silicide layer. The lower semiconductor layer 3b, the intermediate semiconductor layer 3c, and the upper semiconductor layer 3d are, for example, polysilicon layers. The second interlayer insulating film 4 is, for example, a silicon oxide film or a silicon nitride film. The gate layer 5 is, for example, a polysilicon layer.

The plurality of insulating layers 6 and the plurality of electrode layers 7 are alternately stacked to form a stacked layer film on the gate layer 5. This stacked layer film is an example of a first film. The third interlayer insulating film 8 is formed on the stacked layer film. The insulating layer 6 is, for example, a silicon oxide film. The electrode layer 7 is, for example, a tungsten layer. The third interlayer insulating film 8 is, for example, a silicon oxide film. Since the insulating layer 6 is formed between the electrode layers 7, the electrode layers 7 are stacked so as to be separated from each other in the Z direction.

FIG. 1 shows a plurality of first columnar portions CL1 that are formed so as to penetrate the third interlayer insulating film 8, the plurality of electrode layers 7, the plurality of insulating layers 6, the gate layer 5, the second interlayer insulating film 4, the upper semiconductor layer 3d, and the intermediate semiconductor layer 3c. The first columnar portion CL1 has a columnar shape extending in the Z direction. Each of the first columnar portions CL1 includes the memory insulating film 11 and the channel semiconductor layer 12 that are sequentially formed on the surfaces of the third interlayer insulating film 8, the plurality of electrode layers 7, the plurality of insulating layers 6, the gate layer 5, the second interlayer insulating film 4, the upper semiconductor layer 3d, and the lower semiconductor layer 3b. The channel semiconductor layer 12 is formed directly on and in contact with the intermediate semiconductor layer 3c and is electrically connected to the intermediate semiconductor layer 3c.

Figure 2:
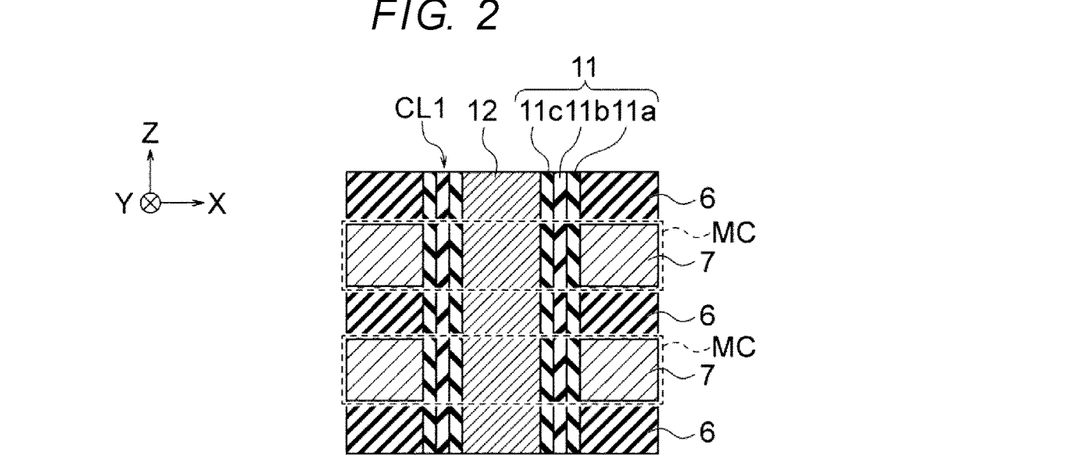
FIG. 2 is an enlarged cross-sectional view showing the structure of the semiconductor device of the first embodiment.

As shown in FIG. 2, the memory insulating film 11 includes a block insulating film 11a, a charge storage layer 11b, and a tunnel insulating film 11c which are sequentially formed on surfaces of the insulating layers 6 and the electrode layers 7. FIG. 2 is an enlarged sectional view showing the structure of the semiconductor device of the first embodiment, specifically, a region A shown in FIG. 1. The block insulating film 11a is, for example, a silicon oxide film. The charge storage layer 11b is, for example, a silicon nitride film. The tunnel insulating film 11c is, for example, a silicon oxide film. The channel semiconductor layer 12 is, for example, a polysilicon layer. The channel semiconductor layer 12 is an example of a first semiconductor layer. Each of electrode layers 7 forms a memory cell MC together with the first columnar portion CL1 and functions as a word line.

FIG. 1 further shows a plurality of element isolation insulating films 13 that are formed to penetrate the third interlayer insulating film 8, the plurality of electrode layers 7, the plurality of insulating layers 6, the gate layer 5, the second interlayer insulating film 4, and the upper semiconductor layer 3d. The element isolation insulating film 13 has a plate-like shape extending in the Y direction. The element isolation insulating film 13 is, for example, a silicon oxide film.

FIG. 1 shows, as an example, an XZ cross section in which four first columnar portions CL1 are provided between element isolation insulating films 13, but the number of the first columnar portions CL1 between the element isolation insulating films 13 in the XZ cross section may be other than four. Details of the arrangement of the first columnar portions CL1 will be described later.

FIGS. 3 to 16 are cross-sectional views showing a method of manufacturing the semiconductor device of the first embodiment.

Figure 3:
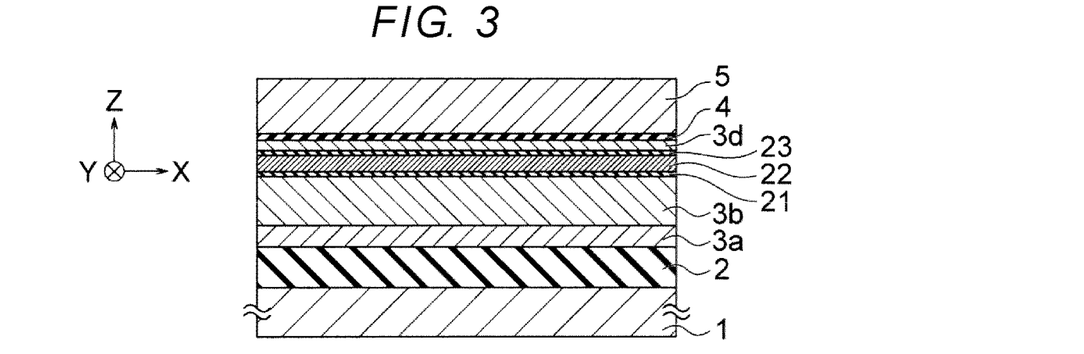
FIGS. 3 to 16 are cross-sectional views showing a method of manufacturing the semiconductor device of the first embodiment.

First, the first interlayer insulating film 2, the metal layer 3a, the lower semiconductor layer 3b, a first protective film 21, a sacrificial layer 22, a second protective film 23, the upper semiconductor layer 3d, a second interlayer insulating film 4, and the gate layer 5 are sequentially formed on the substrate 1 (FIG. 3). The first protective film 21 is, for example, a silicon oxide film. The sacrificial layer 22 is, for example, a polysilicon layer. The second protective film 23 is, for example, a silicon oxide film.

Figure 4:
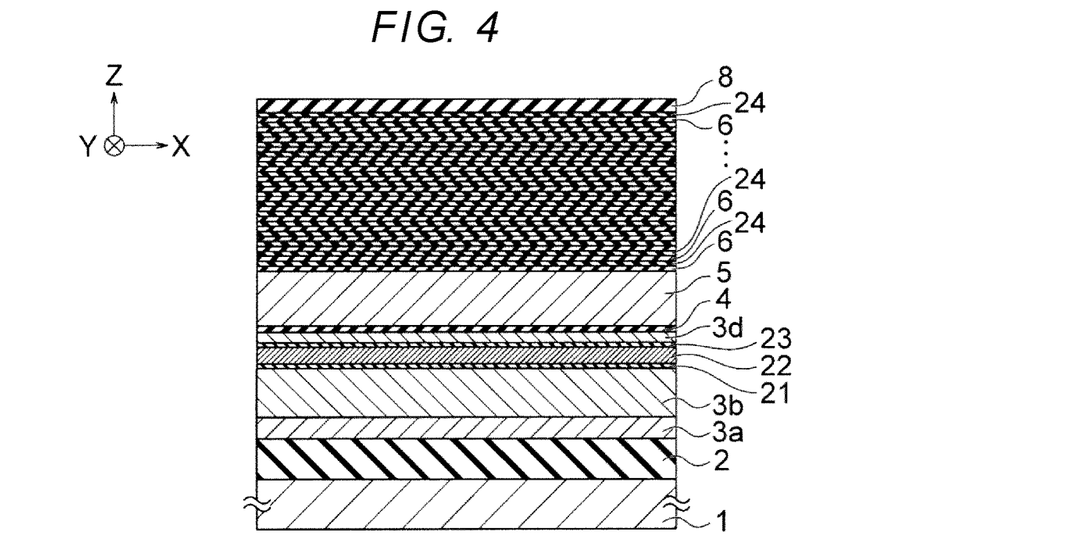

Next, the plurality of insulating layers 6 and a plurality of sacrificial layers 24 are sequentially formed on the gate layer 5, and the third interlayer insulating film 8 is formed on these insulating layers 6 and sacrificial layers (FIG. 4). Each sacrificial layer 24 is, for example, a silicon nitride film. The insulating layer 6 is an example of a first insulating layer, and the sacrificial layer 24 is an example of a second insulating layer. The sacrificial layer 24 is replaced with the electrode layer 7 by a process to be described later.

Figure 5:
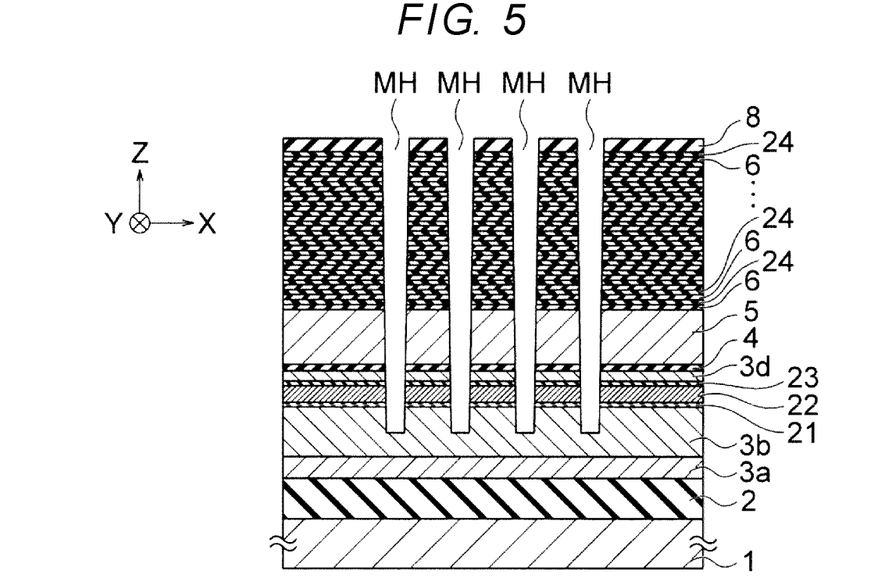

Next, a plurality of memory holes MH penetrating through the third interlayer insulating film 8, the plurality of sacrificial layers 24, the plurality of insulating layers 6, the gate layer 5, the second interlayer insulating film 4, the upper semiconductor layer 3d, the second protective film 23, the sacrificial layer 22, and the first protective film 21, are formed by lithography and reactive ion etching (RIE) (FIG. 5).

Figure 6:
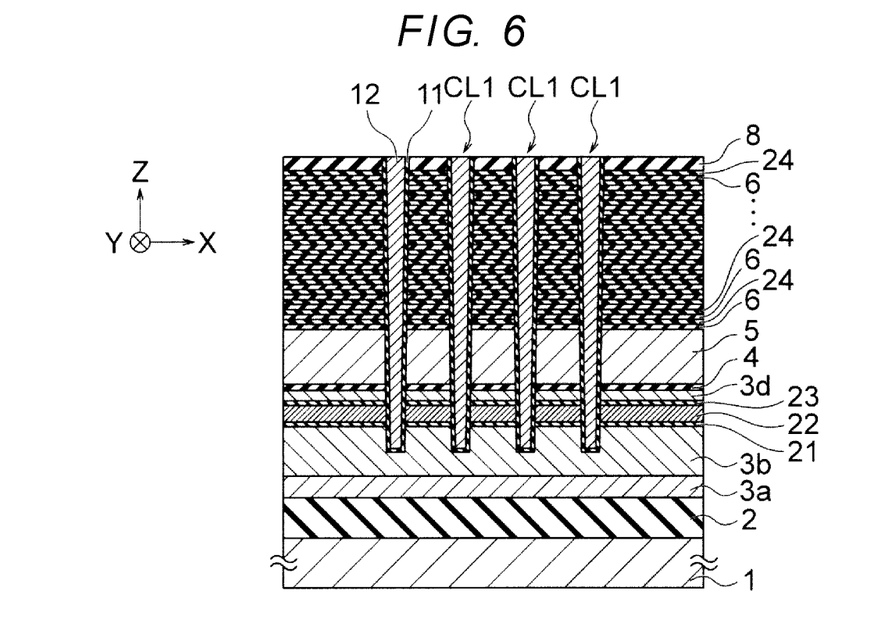

Next, the memory insulating film 11 and the channel semiconductor layer 12 are sequentially formed in these memory holes MH (FIG. 6). As a result, a plurality of first columnar portions CL1 are formed in these memory holes MH. The memory insulating film 11 is formed by sequentially forming the above-described block insulating film 11a, the charge storage layer 11b, and the tunnel insulating film 11c in the memory hole MH.

Figure 7:
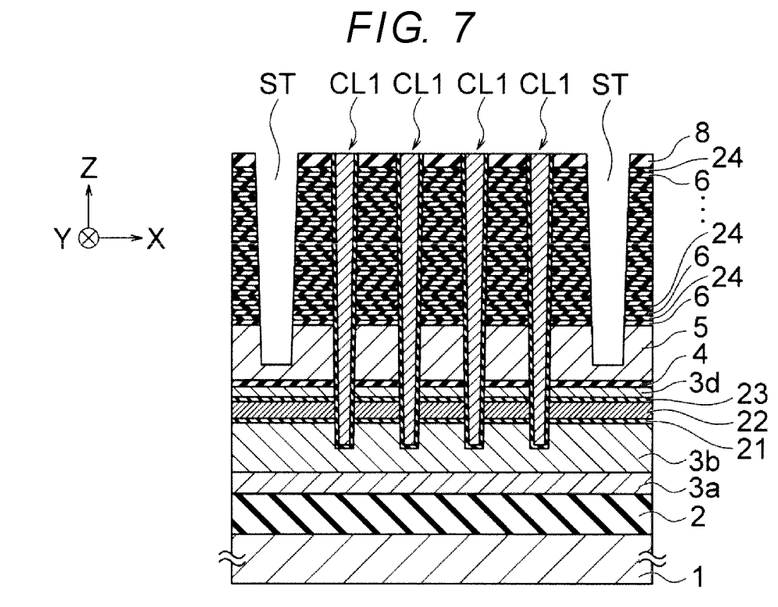
Figure 8:
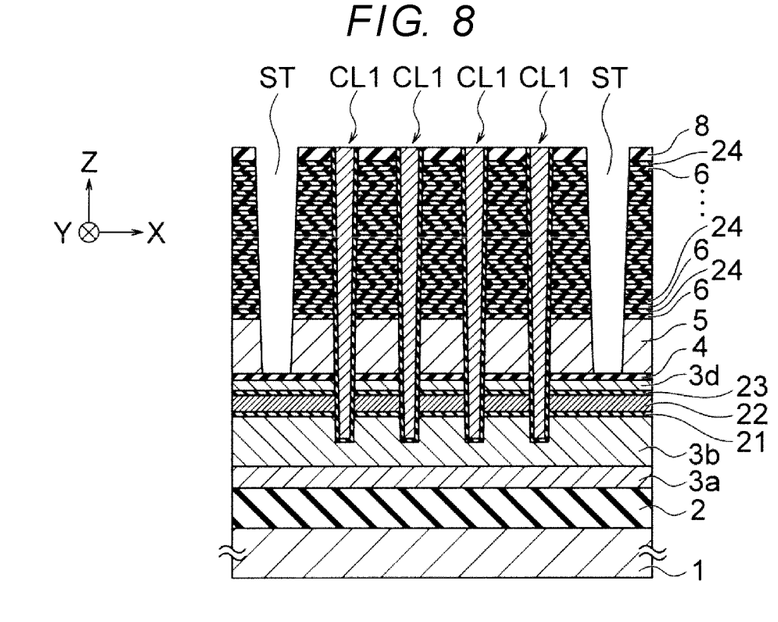
Figure 9:
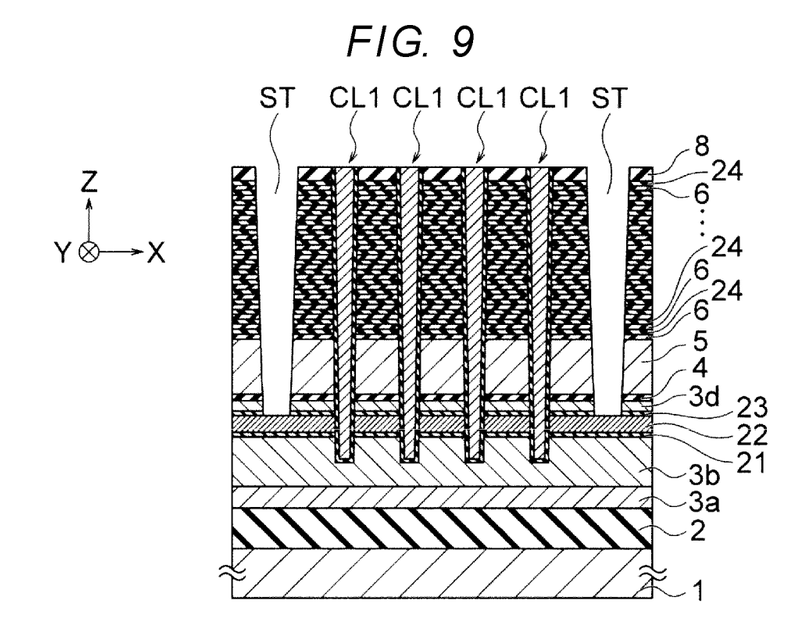
Figure 10:
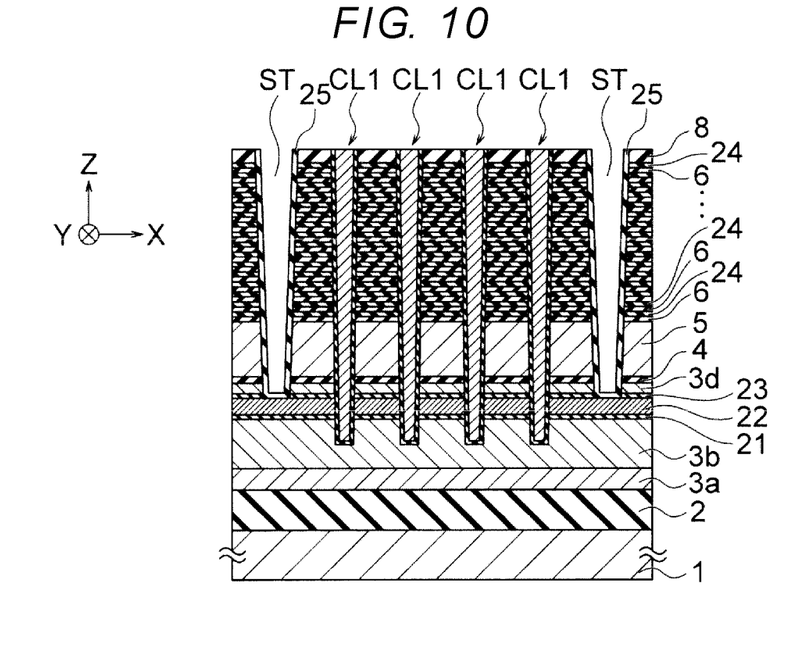

Next, a plurality of element isolation grooves ST penetrating through the third interlayer insulating film 8, the plurality of sacrificial layers 24, the plurality of insulating layers 6, and the gate layer 5 are formed by lithography and RIE (FIGS. 7 and 8). The RIE of the present embodiment is performed by using a first etching gas before the step shown in FIG. 7 and is performed by using a second etching gas different from the first etching gas after the step shown in FIG. 7.

Figure 11:
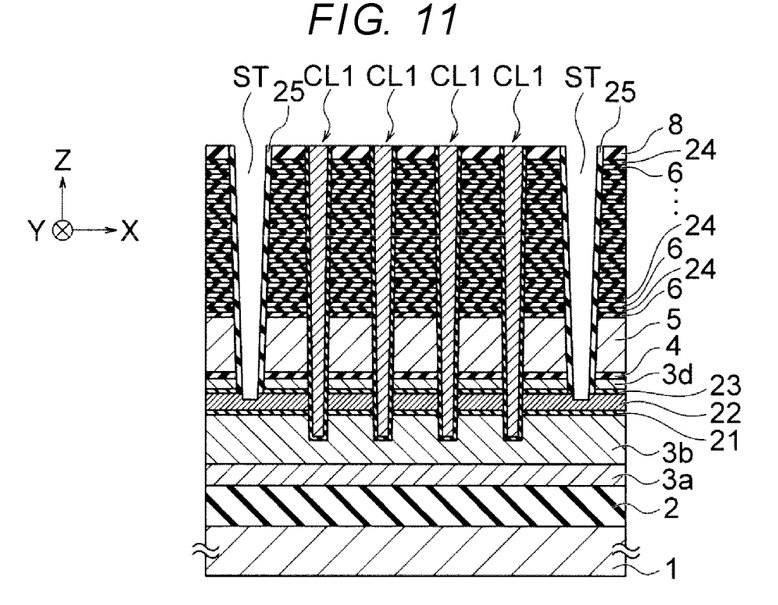

Next, the second protective film 23 is removed by etching from the bottom surface of the element isolation groove ST (FIG. 9), a liner layer 25 is formed on the inner surface of the element isolation groove ST (FIG. 10), and the liner layer 25 is removed by etching from the bottom surface of the element isolation groove ST (FIG. 11). As a result, the side surface of the element isolation groove ST is protected by the liner layer 25, while the sacrificial layer 22 is exposed on the bottom surface of the element isolation groove ST. The liner layer 25 is, for example, a silicon nitride film.

Figure 12:
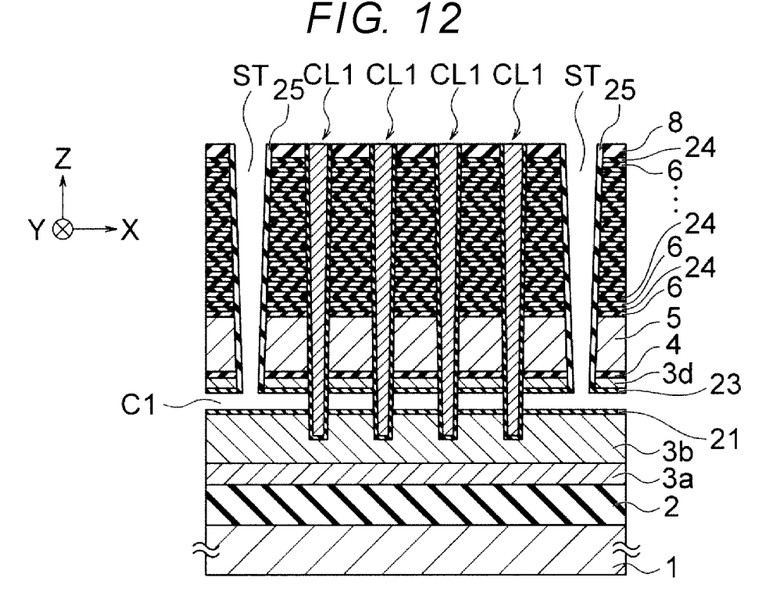

Next, the sacrificial layer 22 is removed by wet etching through the element isolation groove ST (FIG. 12). As a result, a cavity (air gap) C1 is formed between the first protective film 21 and the second protective film 23, and the memory insulating film 11 is exposed on the side surface of the cavity C1.

Figure 13:
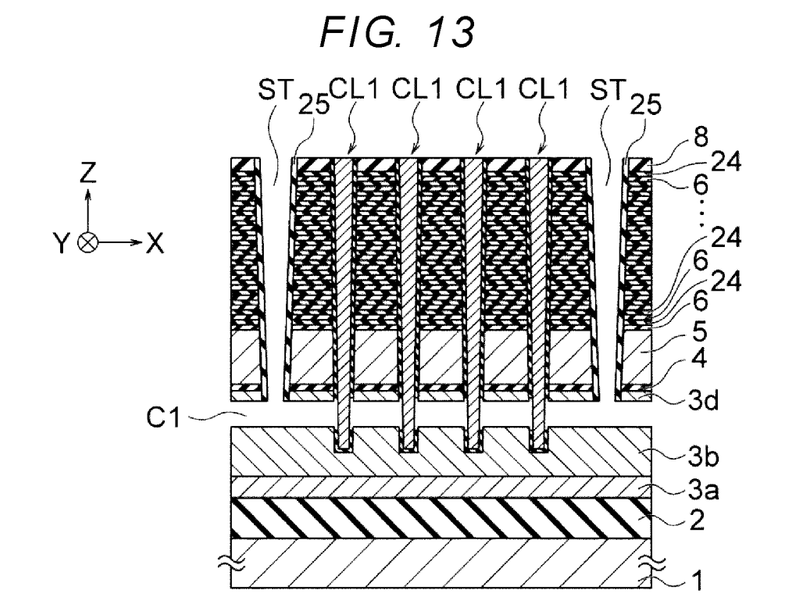

Next, the first protective film 21, the second protective film 23, and the memory insulating film 11 that are exposed to the cavity C1 are removed by chemical dry etching (CDE) through the element isolation groove ST (FIG. 13). As a result, the upper semiconductor layer 3d is exposed on the upper side of the cavity C1, the lower semiconductor layer 3b is exposed on the lower side of the cavity C1, and the channel semiconductor layer 12 is exposed within the cavity C1.

Figure 14:
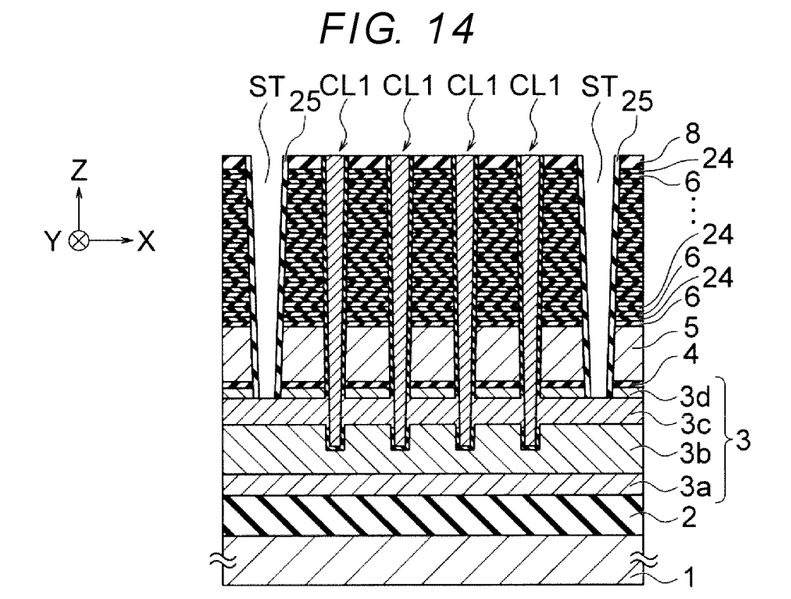

Next, the intermediate semiconductor layer 3c is formed in the cavity C1 by epitaxial growth using the upper semiconductor layer 3d, the lower semiconductor layer 3b, and the channel semiconductor layer 12 exposed in the cavity C1 (FIG. 14). As a result, the intermediate semiconductor layer 3c in contact with the upper semiconductor layer 3d, the lower semiconductor layer 3b, and the channel semiconductor layer 12 is formed.

Figure 15:
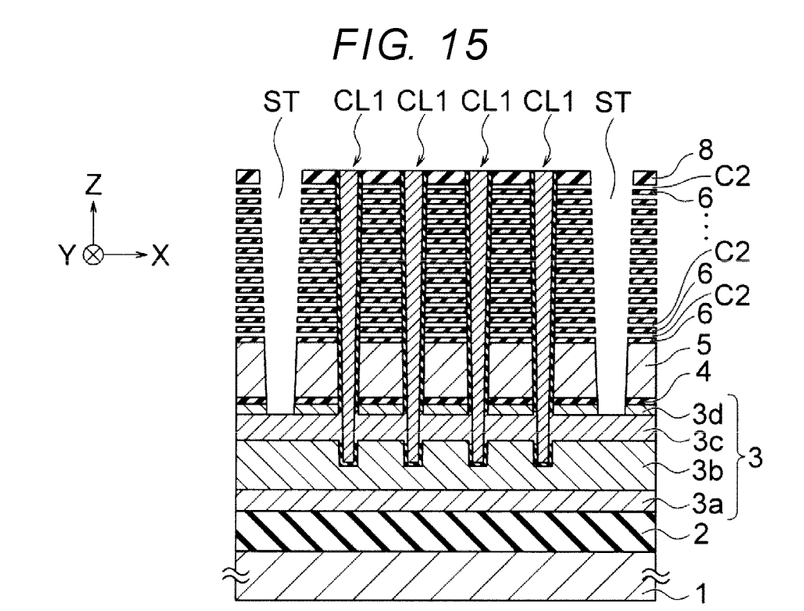

Next, the liner layer 25 in the element isolation groove ST and the sacrificial layer 24 between the insulating layers 6 are removed by wet etching or dry etching through the element isolation groove ST (FIG. 15). As a result, a plurality of cavities (air gaps) C2 are formed between the insulating layers 6.

Figure 16:
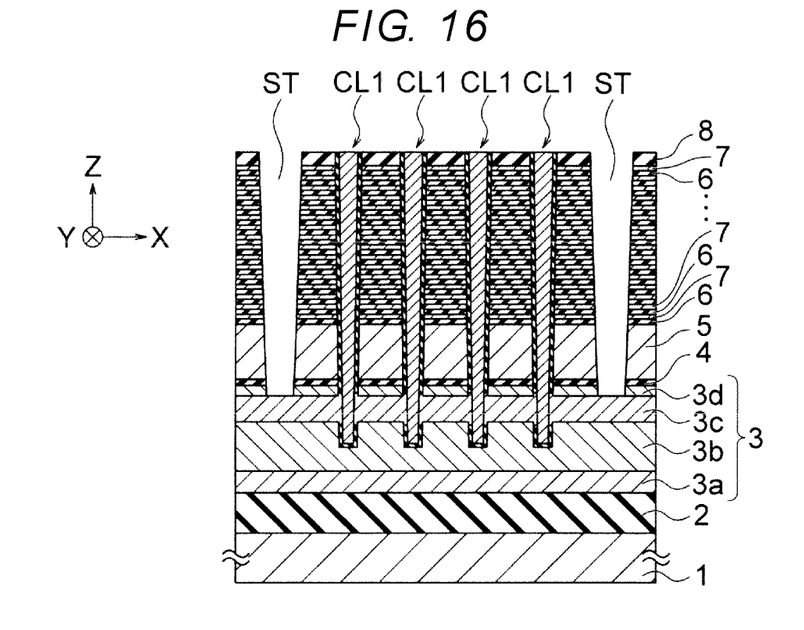

Next, the plurality of electrode layers 7 are formed in these cavities C2 by chemical vapor deposition (CVD) (FIG. 16). As a result, a stacked layer film including alternating layers of insulating layers 6 and electrode layers 7 is formed between the gate layer 5 and the third interlayer insulating film 8.

Thereafter, the element isolation insulating film 13 is formed in the element isolation groove ST. Furthermore, various plugs, wires, interlayer insulating films, and the like are formed on the substrate 1. In this way, the semiconductor device shown in FIG. 1 is manufactured.

Figure 17:
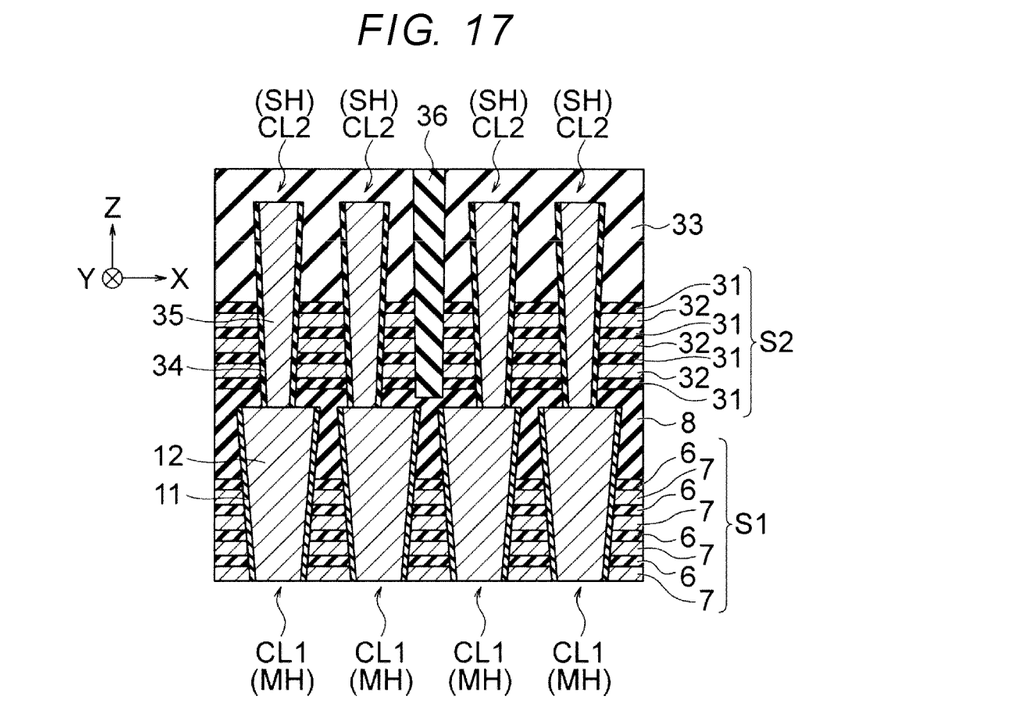
FIG. 17 is a cross-sectional view showing the structure of the semiconductor device of the first embodiment.

FIG. 17 is a cross-sectional view showing the structure of the semiconductor device of the first embodiment.

In FIG. 17, in addition to the components shown in FIG. 1, a plurality of insulating layers 31, a plurality of electrode layers 32, a fourth interlayer insulating film 33, a gate insulating film 34, a channel semiconductor layer 35, and an SH insulating film 36 are provided.

As described above, the plurality of insulating layers 6 and the plurality of electrode layers 7 are alternately stacked to form stacked layer film S1 on the gate layer 5. The stacked layer film S1 is an example of the first film. The third interlayer insulating film 8 is formed on the stacked layer film S1. The insulating layer 6 is, for example, a silicon oxide film. The electrode layer 7 is, for example, a tungsten layer. The third interlayer insulating film 8 is, for example, a silicon oxide film.

FIG. 17 shows the plurality of memory holes MH formed so as to penetrate the stacked layer film S1 and the plurality of first columnar portions CL1 formed in the memory holes MH. The first columnar portion CL1 has a columnar shape extending in the Z direction. Each of the first columnar portions CL1 includes the memory insulating film 11 and the channel semiconductor layer 12 which are sequentially formed on the inner surface of the memory holes formed in the stacked layer film S1. The channel semiconductor layer 12 is an example of the first semiconductor layer. Each of the electrode layers 7, for example, forms the memory cell MC (FIG. 2) together with the first columnar portion CL1 and functions as a word line.

The plurality of insulating layers 31 and the plurality of electrode layers 32 are stacked films S2 alternately formed on the third interlayer insulating film 8. The stacked layer film S2 is an example of the second film. The fourth interlayer insulating film 33 is formed on the stacked layer film S2. The insulating layer 31 is, for example, a silicon oxide film. The electrode layer 32 is, for example, a tungsten layer. The fourth interlayer insulating film 33 is, for example, a silicon oxide film. The insulating layer 31, the electrode layer 32, and the fourth interlayer insulating film 33 may be formed by, for example, a method similar to the method of forming the insulating layer 6, the electrode layer 7, and the third interlayer insulating film 8 described with reference to FIGS. 3 to 16. Since the insulating layer 31 is formed between the electrode layers 32, the electrode layers 32 are stacked so as to be separated from each other in the Z direction.

FIG. 17 shows a plurality of holes SH formed so as to penetrate the stacked layer film S2, and a plurality of second columnar portions CL2 formed in these holes SH. The second columnar portion CL2 has a columnar shape extending in the Z direction. Each of the second columnar portions CL2 is formed on the corresponding first columnar portion CL1 and includes the gate insulating film 34 and the channel semiconductor layer 35 which are sequentially formed on the inner surface of the holes SH formed in the stacked layer film S2. The gate insulating film 34 is, for example, a silicon oxide film. The channel semiconductor layer 35 is, for example, a polysilicon layer. The channel semiconductor layer 35 is an example of a second semiconductor layer. Each of the electrode layers 32, for example, forms a transistor such as a select transistor together with the second columnar portion CL2 and functions as a gate electrode of a selection gate or the like. For example, the second columnar portion CL2 may be formed by a method similar to the method of forming the first columnar portion CL1 described with reference to FIGS. 3 to 16.

The gate insulating film 34 may be replaced with an insulating film having the same configuration as the memory insulating film 11. Specifically, the memory insulating film 11 includes three layers of the block insulating film 11a, the charge storage layer 11b, and the tunnel insulating film 11c (FIG. 2), and the gate insulating film 34 may also be replaced with such three layers.

The SH insulating film 36 is formed so as to be separated from the hole SH (and the second columnar portion CL2 formed therein) in the stacked layer film S2 and the fourth interlayer insulating film 33 and has a plate shape extending in the Y direction. That is, the SH insulating film 36 is formed at a position not in contact with the hole SH. The minimum width of the SH insulating film 36 in the X direction is set to, for example, 20 nm or more in consideration of withstand pressure. The minimum width in the X direction of the SH insulating film 36 of the present embodiment is the width in the X direction of the lower surface of the SH insulating film 36. The SH insulating film 36 is, for example, a silicon oxide film. The SH insulating film 36 is an example of a first insulating film. The SH insulating film 36 may be formed by, for example, a method similar to the method of forming the element isolation insulating film 13 described with reference to FIGS. 3 to 16.

As will be described later, the semiconductor device of the present embodiment includes a plurality of SH insulating films 36 extending in the Y direction and adjacent to each other in the X direction, and the holes SH (and the second columnar portions CL2) are provided between the SH insulating films 36. The SH insulating film 36 has a plate-like shape extending in the Y direction and the Z direction. FIG. 17 shows one of these SH insulating films 36.

Both the first columnar portion CL1 and the second columnar portion CL2 of the present embodiment have a circular XY cross section. The maximum diameter of the second columnar portion CL2 is set to be smaller than the maximum diameter of the first columnar portion CL1. The maximum diameter of the first columnar portion CL1 is the diameter of the upper surface of the first columnar portion CL1 in FIG. 17, but may be the diameter of a cross section between the upper surface and the lower surface of the first columnar portion CL1 if it has a bowed shape. This also applies to the second columnar portion CL2.

In the present embodiment, each of the second columnar portions CL2 is provided on the corresponding first columnar portion CL1 so that the lower surface of each second columnar portions CL2 does not protrude from the upper surface of the corresponding first columnar portion CL1. That is, the lower surface of each second columnar portion CL2 is located on the upper surface of the corresponding first columnar portion CL1. The lower surface of each second columnar portion CL2 may be located at the center of the upper surface of the corresponding first columnar portion CL1 or at a position shifted from the center of the upper surface of the corresponding first columnar portion CL1. In addition, even if the lower surface of a certain second columnar portion CL2 protrudes from the upper surface of the corresponding first columnar portion CL1, if the channel semiconductor layer 35 of the second columnar portion CL2 is in contact with the corresponding channel semiconductor layer 12 of the first columnar portion CL1 and is not in contact with any electrode layer 7, such protrusion is allowed.

As long as the SH insulating film 36 and the second columnar portion CL2 do not come in contact with each other, the SH insulating film 36 may be provided at a position overlapping with the first columnar portion CL1 in the Z direction, or may be provided at a position not overlapping with the first columnar portion CL1 in the Z direction. In FIG. 17, the SH insulating film 36 is provided at a position slightly overlapping with the two first columnar portions CL1 in the Z direction. In order to reduce the chip size, the SH insulating film 36 of the present embodiment is provided at a position overlapping with the first columnar portion CL1 in the Z direction. Details of such arrangement will be described later.

In addition, in the present embodiment, the hole SH is formed after the formation of the memory hole MH, but the memory hole MH and the hole SH may be formed at the same time. In this case, the memory hole MH and the hole SH are formed by the following procedure, for example. First, a first film S1 is formed on the gate layer 5, the third interlayer insulating film 8 is formed on the first film S1, a second film S2 is formed on the third interlayer insulating film 8, and a part of the fourth interlayer insulating film 33 is formed on the second film S2. Next, a plurality of through via holes penetrating the first film S1, the second film S2, and the like are formed. As a result, the memory hole MH and the hole SH are formed as a part of these through via holes. The memory insulating film 11, the channel semiconductor layer 12, the gate insulating film 34, and the channel semiconductor layer 35 are formed in these through via holes. As a result, the first columnar portion CL1 is formed in the memory hole MH, and the second columnar portion CL2 is formed in the hole SH. A single columnar semiconductor layer extending from the memory hole MH to the hole SH may be formed in each through via hole. In this case, the portion of this semiconductor layer in the memory hole MH becomes the channel semiconductor layer 12, and the portion of this semiconductor layer in the hole SH becomes the channel semiconductor layer 35. These channel semiconductor layers 12 and 35 are examples of the first and second semiconductor layers, respectively.

Next, the structure of the semiconductor device of the first embodiment will be described relative to first and second comparative examples. In order to make the description easy to understand, the elements of the semiconductor device of the first and second comparative examples are also denoted using the same reference numerals as the elements of the semiconductor device of the first embodiment.

Figure 18A:
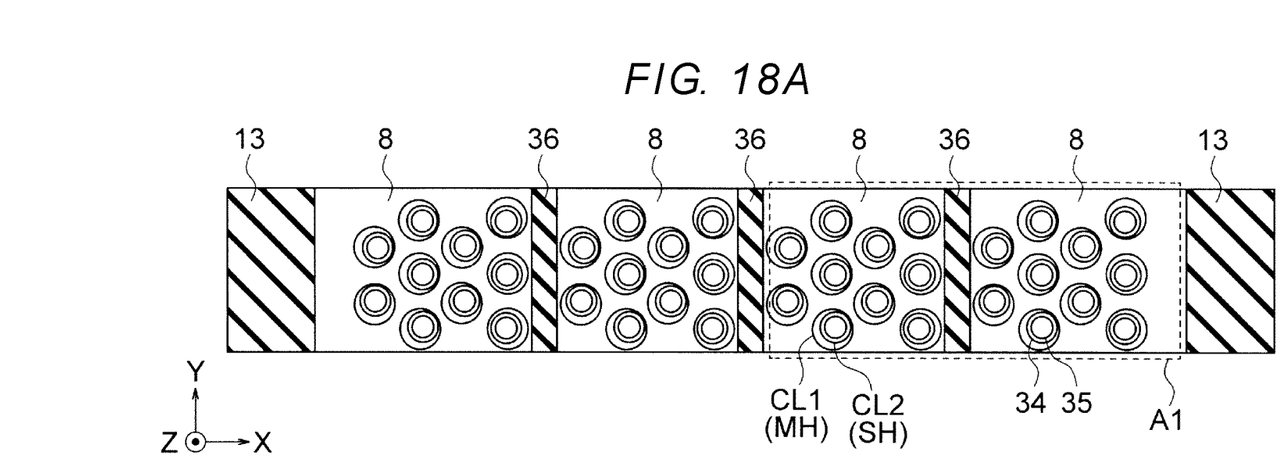
FIGS. 18A and 18B are cross-sectional views showing a structure of a semiconductor device of a first comparative example.
Figure 18B:
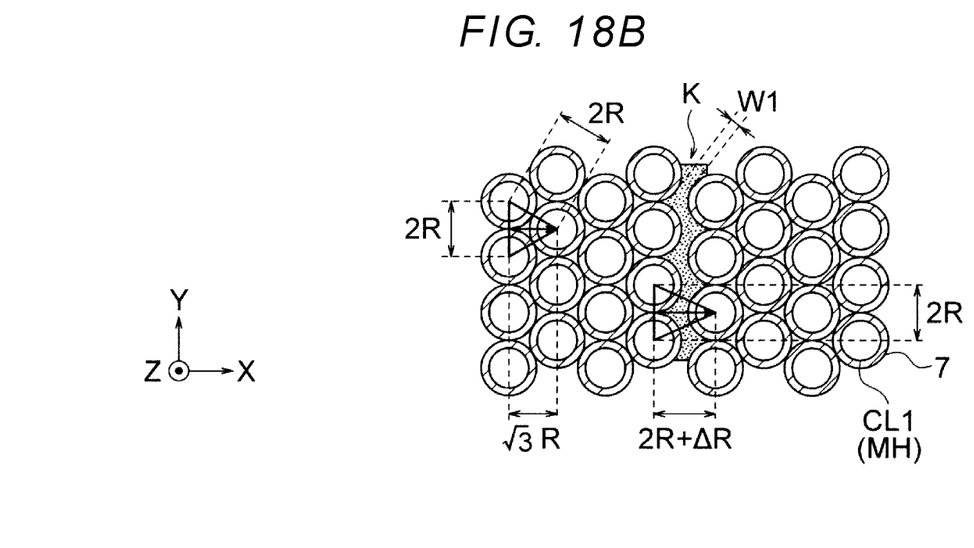

FIGS. 18A and 18B are cross-sectional views showing the structure of the semiconductor device of a first comparative example.

FIG. 18A shows the XY cross section at the upper surface of the first columnar portion CL1 and the lower surface of the second columnar portion CL2. However, in order to make the description easy to understand, the SH insulating film 36 is also shown in this XY cross section. FIG. 18B is an enlarged view of a region A1 shown in FIG. 18A, more accurately showing the positional relationship between the first columnar portions CL1.

As shown in FIG. 18A, the element isolation insulating film 13 and the SH insulating film 36 have a shape extending in the Y direction. FIG. 18A shows, as an example, two element isolation insulating films 13 and three SH insulating films 36 located between the element isolation insulating films 13. The first columnar portions CL1 are arranged so as to form a plurality of columns extending in the Z direction between the element isolation insulating films 13. These first columnar portions CL1 are arranged in a triangular lattice pattern below the region between the SH insulating films 36. The second columnar portion CL2 is provided on the first columnar portion CL1.

FIG. 18B shows four rows of first columnar portions CL1 (hereinafter, referred to as "first columnar portions CL1 of a first group") forming a triangular lattice on the left side in the drawing and four rows of first column portions CL1 (hereinafter, referred to as "first columnar portions CL1 of a second group") on the right in the drawing, which forms a triangular lattice. Each of these triangles is an equilateral triangle with a side length of 2R. The value of R is, for example, 50 nm to 100 nm.

FIG. 18B further shows the electrode layer 7 annularly formed around each first columnar portion CL1. In the first group, the electrode layers 7 around different first columnar portions CL1 are in contact with each other and are electrically connected to each other. Similarly, in the second group, the electrode layers 7 around different first columnar portions CL1 are in contact with each other and are electrically connected to each other.

FIG. 18B further shows a region K between the first columnar portion CL1 of the first group and the first columnar portion CL1 of the second group. For example, there is a case in which another row of first columnar portions (e.g., dummy columnar portions) CL1 is provided in the region K and the SH insulating films 36 are provided on these dummy columnar portions CL1. The second columnar portions CL2 cannot be provided on these dummy columnar portions CL1. If such a configuration is adopted, the chip size becomes large.

Therefore, in the first comparative example, a configuration in which the dummy columnar portions CL1 are not provided in the region K is adopted. In this case, the region K may be narrowed and the chip size may be reduced as compared with the case where the dummy columnar portions CL1 are provided in the region K. However, there is a requirement that the SH insulating film 36 and the second columnar portion CL2 are not brought into contact with each other, and therefore there is a limit to narrowing the region K. As a result, when the electrode layer 7 is formed around the first columnar portion CL1, large voids are generated in the electrode layer 7, and the entire region K becomes a void, for example. When large voids are generated, a large amount of fluorine gas generated from the tungsten hexafluoride gas for forming the electrode layer (tungsten layer) 7 accumulates in the voids, possibly deteriorating the silicon oxide film and the like.

Figure 19A:
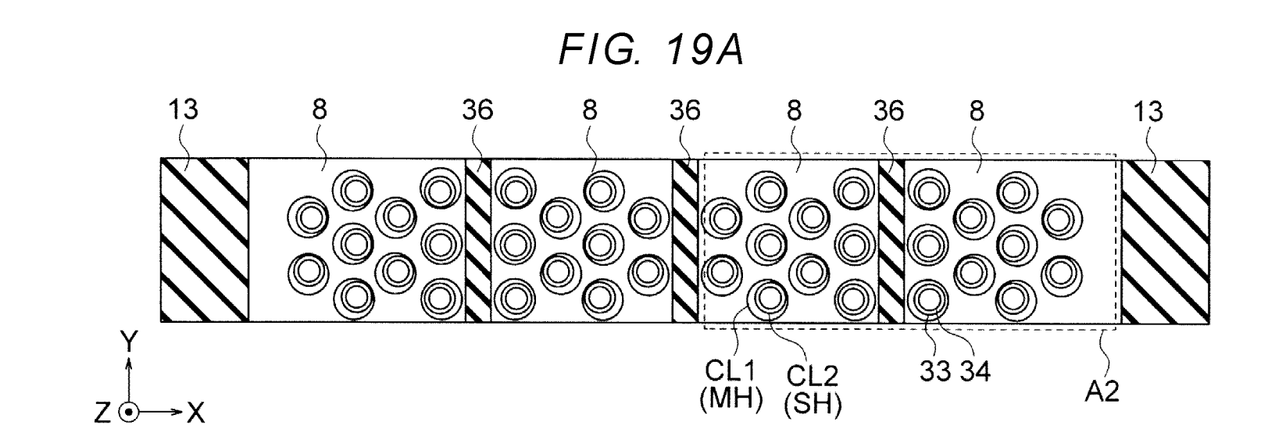
FIGS. 19A and 19B are cross-sectional views showing the structure of the semiconductor device of the first embodiment.
Figure 19B:
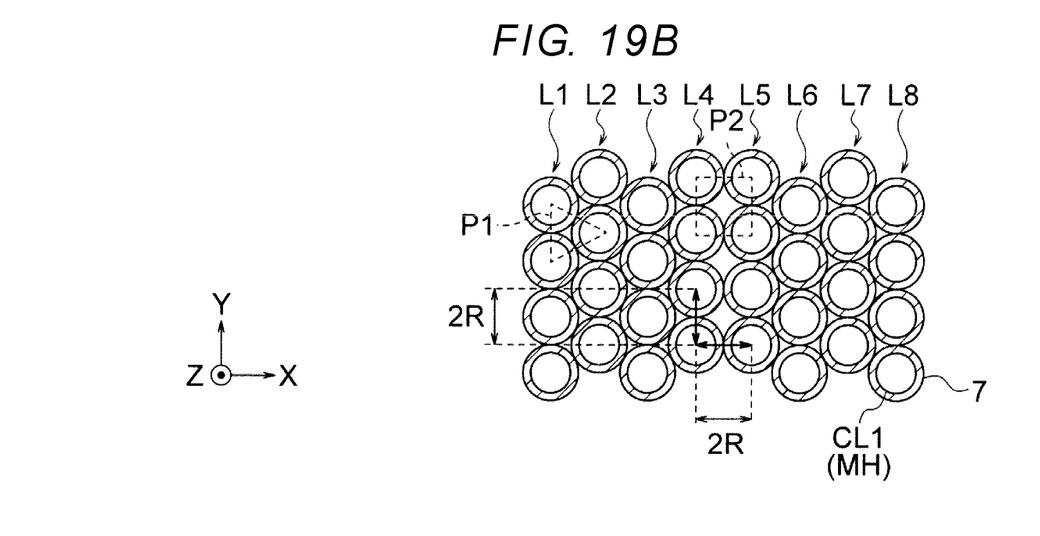

FIG. 18B shows a triangular lattice formed by the first columnar portions CL1 of the first group and the first columnar portion CL1 of the second group, showing the height "2R+ΔR" of this triangle. The value of 2R+ΔR is, for example, 110 nm to 210 nm. Specifically, the value of 2R is, for example, 100 nm to 200 nm, and the value of ΔR is, for example, about 10 nm. 2R+ΔR corresponds to the pitch in the X direction (hereinafter, referred to as "group pitch") between the first columnar portion CL1 of the first group and the first columnar portion CL1 of the second group. In FIGS. 19A and 19B which will be described later, this group pitch is reduced to 2R.

FIG. 18B further shows a distance W1 between the electrode layer 7 around the first columnar portion CL1 of the first group and the electrode layer 7 around the first columnar portion CL1 of the second group. The distance W1 in the present comparative example is, for example, 20 nm to 30 nm, and the entire region K becomes a large void.

FIGS. 19A and 19B are cross-sectional views showing the structure of the semiconductor device of the first embodiment.

FIGS. 19A and 19B are cross-sectional views corresponding to FIGS. 18A and 18B, respectively. FIG. 19B is an enlarged view of a region A2 shown in FIG. 19A, more accurately showing the positional relationship between the first columnar portions CL1.

As shown in FIG. 19A, the element isolation insulating film 13 and the SH insulating film 36 have a shape extending in the Y direction. The first columnar portions CL1 are arranged so as to form a plurality of columns extending in the Z direction between the element isolation insulating films 13. These first columnar portions CL1 are arranged in a triangular lattice pattern below the region between the SH insulating films 36. The second columnar portion CL2 is provided on the first columnar portion CL1.

FIG. 19B shows the four rows (L1 to L4 rows) of first columnar portions CL1 in the first group, and four rows (L5 to L8 rows) of the first columnar portions CL1 in the second group. A reference numeral P1 indicates a triangular lattice formed by the first columnar portions CL1 in the first group or the first columnar portions CL1 in the second group. This triangle may be an equilateral triangle or a non-equilateral triangle, but is an equilateral triangle with a side length of 2R in the present embodiment. The value of R is, for example, 50 nm to 100 nm. This triangle is formed by one side parallel to the Y direction and the other two sides.

Regarding the L1 row and the L2 row, the first columnar portions CL1 in the L2 row are displaced by R in the Y direction from the first columnar portions CL1 in the L1 row. This relationship also holds between the L2 row and L3 row, between L3 row and L4 row, between L5 row and L6 row, between L6 row and L7 row, and between L7 row and L8 row. As a result, the first columnar portions CL1 of the first group are arranged in a triangular lattice pattern, and the first columnar portions CL2 of the second group are also arranged in a triangular lattice pattern.

On the other hand, regarding the L4 row and the L5 row, the first columnar portions CL1 in the L5 row are arranged without being displaced in the Y direction with respect to the first columnar portions CL1 in the L4 row. That is, the first columnar portions CL1 in the L4 row and the first columnar portions CL1 in the L5 row are arranged mirror-symmetrically with respect to an YZ plane. Therefore, the first columnar portions CL1 in the L4 row and the L5 row are arranged in a square or rectangular lattice pattern. In other words, the positions of the first columnar portions CL1 in the L5 row are shifted from the triangular lattice by a half cycle in the Y direction with reference to the positions of the first columnar portions CL1 in the L4 row.

The first columnar portions CL1 in the L4 row form a square or rectangular lattice with the first columnar portions CL1 in the L5 row and form a triangular lattice with the first columnar portions CL1 in the L1 to L3 rows. Similarly, the first columnar portions CL1 in the L5 row form a square or rectangular lattice with the first columnar portions CL1 in the L4 row and form a triangular lattice with the first columnar portions CL1 in the L6 to L8 rows.

A reference numeral P2 indicates a rectangular lattice formed by the first columnar portions CL1 in the L4 row and the L5 row. This rectangle may be a square or a rectangle, but is a square with a side length of 2R in the present embodiment. This square is formed by two sides parallel to the Y direction and two sides parallel to the X direction. In the case of adopting a rectangular lattice, it is preferable that the length of two sides parallel to the Y direction is 2R and the length of the two sides parallel to the X direction is shorter than 2R but 2R is acceptable as shown in FIG. 19B.

Here, the pitch in the X direction (inter-group pitch) between the first columnar portions CL1 of the first group and the first columnar portions CL1 of the second group will be described. As described above, the inter-group pitch in the first comparative example is 2R+ΔR (110 nm to 210 nm). On the other hand, the inter-group pitch in the present embodiment is 2R (100 nm to 200 nm). The inter-group pitch in the present embodiment corresponds to the length of the side parallel to the X direction of the above-described square.

In the present embodiment, for example, it is necessary that the inter-group pitch is equal to or smaller than the minimum pitch 2R of the triangle and the value of 2R is equal to or larger than the minimum dimension that avoids contact between the second columnar portion CL2 and the SH insulating film 36. In the present embodiment, by reducing the inter-group pitch to the minimum pitch, the first columnar portions CL1 in the L4 row and the L5 row are provided at positions overlapping with one SH insulating film 36 in the Z direction. Therefore, the first columnar portions CL1 of the present embodiment are arranged in a triangular lattice pattern below the region between the SH insulating films 36 and arranged in a square (or rectangle) lattice pattern below these SH insulating films 36.

In the present embodiment, the center-to-center distance 2R between the first columnar portions CL1 forming the square lattice is the same as the center-to-center distance 2R between the first columnar portions CL1 forming the triangular lattice. Therefore, according to the present embodiment, it is possible to prevent large voids from forming in the electrode layer 7 when the electrode layer 7 is formed around the first columnar portion CL1. In FIG. 19B, it is to be noted that the electrode layer 7 around the first columnar portions CL1 in the L4 row and the electrode layer 7 around the first columnar portions CL1 in the L5 row are in contact with each other. In other words, the region K of the first comparative example is blocked from being formed in the present embodiment.

In the present embodiment, the center-to-center distance (hereinafter, referred to as "L4-L5 distance") between the first columnar portion CL1 in the L4 row and the first columnar portion CL1 in the L5 row is 2R, which is the same as the center-to-center distance between the first columnar portions CL1 forming the triangular lattice. When it is possible to further shorten the distance L4-L5, the distance L4-L5 may be shorter than 2R. In addition, in a case where this triangle is not an equilateral triangle, the L4-L5 distance may be the minimum value (that is, the length of the shortest side of the triangle) of the center-to-center distance between the first columnar portions CL1 forming the triangular lattice or may be shorter than this minimum value. In addition, in a case where the center-to-center distance between the first columnar portions CL1 forming the triangular lattice varies depending on the position on a substrate 1, the L4-L5 distance may be the minimum value of the center-to-center distances that vary, or may be shorter than this minimum value.

When forming the memory hole MH of the present embodiment, the memory hole MH is formed so as to form the above-described triangular or rectangular lattice (FIG. 5). Thereafter, by forming the first columnar portions CL in the memory holes MH, it is possible to form the first columnar portions CL arranged in a triangular lattice pattern or a rectangular lattice pattern (FIG. 6). A region in which the first columnar portions CL are arranged in a triangular lattice pattern is an example of a first region and a region in which the first columnar portions CL are arranged in a rectangular lattice pattern is an example of a second region. Thereafter, each SH insulating film 36 is formed on this second region.

Figure 20:
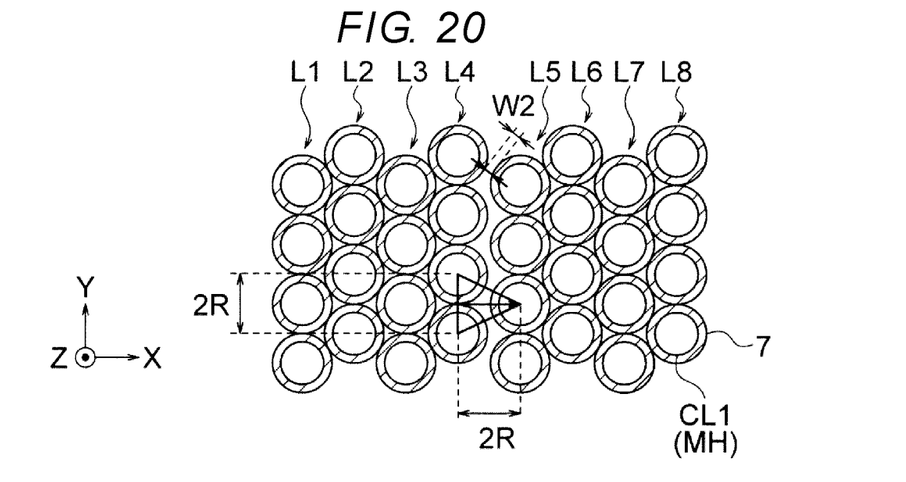
FIG. 20 is a cross-sectional view showing a structure of a semiconductor device of a second comparative example.

FIG. 20 is a cross-sectional view showing a structure of a semiconductor device of a second comparative example. FIG. 20 is a cross-sectional view corresponding to FIGS. 18B and 19B.

FIG. 20 shows a triangular lattice formed by the first columnar portions CL1 of the first group (L4 row) and the first columnar portion CL1 of the second group (L5 row), showing the height "2R" of this triangle. It is to be noted that in FIG. 18B, the height of this triangle is "2R+ΔR". Since the height of the triangle decreases from "2R+ΔR" to "2R", the distance between the electrode layer 7 around the first columnar portion CL1 of the first group and the electrode layer 7 around the first columnar portion CL1 of the second group is decreased from W1 to W2. The distance W2 in the present comparative example is, for example, 10 nm to 20 nm.

Here, the pitch in the X direction (inter-group pitch) between the first columnar portions CL1 of the first group and the first columnar portions CL1 of the second group will be described. The inter-group pitch in the present comparative example is 2R (100 nm to 200 nm) similarly to the inter-group pitch in the first embodiment. However, in the present comparative example, the above-described region K is still formed. The reason is that the positions of the first columnar portions CL1 in the L5 row are not shifted from the triangular lattice in the Y direction with reference to the positions of the first columnar portions CL1 in the L4 row. Therefore, in the present comparative example, as in the first comparative example, large voids are generated between the first group and the second group.

On the other hand, in the present embodiment, the positions of the first columnar portions CL1 in the L5 column are shifted from the triangular lattice by a half cycle in the Y direction with reference to the positions of the first columnar portions CL1 in the L4 row (FIG. 19B). As a result, the above-described region K is blocked from being formed. Therefore, according to the present embodiment, it is possible to prevent large voids from forming between the first group and the second group.

As described above, the first columnar portions CL1 of the present embodiment are arranged in a triangular lattice pattern below the region between the SH insulating films 36 and arranged in a square or rectangular lattice pattern below these SH insulating films 36. Therefore, according to the present embodiment, it is possible to appropriately reduce the chip size of the semiconductor device. For example, according to the present embodiment, it is possible to reduce the chip size while preventing problems such as formation of large voids in the electrode layer 7.

If problems such as generation of large voids can be suppressed, the first columnar portions CL1 in the L4 row and L5 row below the SH insulating film 36 may be arranged in other lattice patterns different from the triangular lattice pattern. For example, the first columnar portions CL1 below the SH insulating film 36 may be arranged in a rhombic or parallelogram lattice pattern, which is similar to a square or rectangular lattice pattern. In this case, it is desirable that the center-to-center distance (L4-L5 distance) between the first columnar portion CL1 in the L4 row and the first columnar portion CL1 in the L5 row is equal to or smaller than the minimum value of the center-to-center distance between the first columnar portions CL1 forming the triangular lattice. This is the same as the case where a square or rectangular lattice is adopted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first film that includes a plurality of first electrode layers stacked so as to be separated from each other in a first direction and extending in a second direction and a third direction each crossing the first direction;
    a plurality of first columnar portions that are provided in the first film, include a charge storage layer and a first semiconductor layer, and extend in the first direction through the first electrode layers;
    a second film that is provided on the first film and includes a plurality of second electrode layers stacked so as to be separated from each other in the first direction and extending in the second direction and the third direction;
    a plurality of second columnar portions that are provided in the second film and on the first columnar portions, include a second semiconductor layer, and extend in the first direction through the second electrode layers; and
    a plurality of first insulating films that are provided in the second film so as to be separated from the second columnar portions in the third direction and extend in the first direction through the second electrode layers and the second direction,
    wherein the first columnar portions are arranged in a triangular lattice pattern in first regions and in a square or rectangular lattice pattern in second regions that are separate from the first regions and are aligned with the first insulating films in the first direction.

2. The semiconductor device according to claim 1,
    wherein a triangle of the triangular lattice pattern has a side parallel to the second direction, and
    a square of the square lattice pattern or a rectangle of the rectangular lattice pattern has a first side parallel to the second direction and a second side perpendicular to the second direction.

3. The semiconductor device according to claim 2,
    wherein a length of the first side is equal to a length of the side of the triangle parallel to the second direction.

4. The semiconductor device according to claim 2,
    wherein the length of the second side is equal to or less than the length of the side of the triangle parallel to the second direction.

5. The semiconductor device according to claim 1,
wherein the square or rectangular lattice pattern is formed by two rows of the first columnar portions extending in the second direction below each of the first insulating films.

6. The semiconductor device according to claim 5,
wherein a first row of the two rows of the first columnar portions form the triangular lattice pattern with a third row of the first columnar portions that is adjacent to the first row in the third direction and not below any of the first insulating films, and a second row of the two rows of the first columnar portions form the triangular lattice pattern with a fourth row of the first columnar portions that is adjacent to the second row in the third direction and not below any of the first insulating films.

7. The semiconductor device according to claim 6,
wherein a center-to-center distance between the first columnar portions in the first row and the first columnar portions in the second row is equal to or smaller than the minimum value of a center-to-center distance between the first columnar portions forming the triangular lattice pattern.

8. The semiconductor device according to claim 1,
wherein the diameter of the second columnar portion is smaller than the diameter of the first columnar portion.

9. The semiconductor device according to claim 1,
wherein the first semiconductor layer has a columnar shape extending in the first direction and is at a center portion of the first columnar portion, and a second insulating film, the charge storage layer, and a third insulating film contacting the plurality of first electrode layers are sequentially provided on an outer surface of the first semiconductor layer in the first film.

10. The semiconductor device according to claim 9,
wherein the second semiconductor layer has a columnar shape extending in the first direction and is at a center portion of the second columnar portion, and a fourth insulating film contacting the plurality of second electrode layers is provided on an outer surface of the second semiconductor layer in the second film.

11. A semiconductor device comprising:
a first film that includes a plurality of first electrode layers stacked so as to be separated from each other in a first direction and extending in a second direction and a third direction each crossing the first direction;
a plurality of first columnar portions that are provided in the first film, include a charge storage layer and a first semiconductor layer, and extend in the first direction through the first electrode layers;
a second film that is provided on the first film and includes a plurality of second electrode layers stacked so as to be separated from each other in the first direction and extending in the second direction and the third direction;
a plurality of second columnar portions that are provided in the second film and on the first columnar portions, include a second semiconductor layer, and extend in the first direction through the second electrode layers; and
a plurality of first insulating films that are provided in the second film so as to be separated from the second columnar portions in the third direction and extend in the first direction through the second electrode layers and the second direction,
wherein the first columnar portions are arranged in a triangular lattice pattern in first regions and in a lattice pattern different from the triangular lattice pattern in second regions that are separate from the first regions and are aligned with the first insulating films in the first direction,
the lattice pattern different from the triangular lattice pattern is formed by two rows of the first columnar portions extending in the second direction below each of the first insulating films, and
a center-to-center distance between the first columnar portion in a first row of the two rows and the first columnar portion in a second row of the two rows is equal to or smaller than a minimum value of a center-to-center distance between the first columnar portions forming the triangular lattice pattern.

12. The semiconductor device according to claim 11,
wherein the diameter of the second columnar portion is smaller than the diameter of the first columnar portion.

13. The semiconductor device according to claim 12,
wherein the first semiconductor layer has a columnar shape extending in the first direction and is at a center portion of the first columnar portion, and a second insulating film, the charge storage layer, and a third insulating film contacting the plurality of first electrode layers are sequentially provided on an outer surface of the first semiconductor layer in the first film.

14. The semiconductor device according to claim 13,
wherein the second semiconductor layer has a columnar shape extending in the first direction and is at a center portion of the second columnar portion, and a fourth insulating film contacting the plurality of second electrode layers is provided on an outer surface of the second semiconductor layer in the second film.

* * * * *